United States Patent
Domejean et al.

(10) Patent No.: US 12,525,784 B2
(45) Date of Patent: Jan. 13, 2026

(54) ELECTRICAL SWITCHING DEVICE, AND ASSOCIATED SWITCHING SYSTEM AND METHOD

(71) Applicant: Schneider Electric Industries SAS, Rueil-Malmaison (FR)

(72) Inventors: Eric Domejean, Voreppe (FR); Jérôme Brenguier, L'Albenc (FR)

(73) Assignee: Schneider Electric Industries SAS, Rueil-Malmaison (FR)

( * ) Notice: Subject to any disclaimer, the term of this patent is extended or adjusted under 35 U.S.C. 154(b) by 73 days.

(21) Appl. No.: 18/290,517

(22) PCT Filed: May 19, 2022

(86) PCT No.: PCT/EP2022/063625
§ 371 (c)(1),
(2) Date: Nov. 14, 2023

(87) PCT Pub. No.: WO2022/243464
PCT Pub. Date: Nov. 24, 2022

(65) Prior Publication Data
US 2024/0275158 A1    Aug. 15, 2024

(30) Foreign Application Priority Data

May 20, 2021 (FR) .......................... 2105286

(51) Int. Cl.
*H02H 3/00* (2006.01)
*H02H 3/02* (2006.01)
(Continued)

(52) U.S. Cl.
CPC .......... *H02H 3/021* (2013.01); *H03K 17/567* (2013.01); *H03K 17/6874* (2013.01); *H03K 2017/6875* (2013.01)

(58) Field of Classification Search
None
See application file for complete search history.

(56) References Cited

U.S. PATENT DOCUMENTS 10,797,503 B2 * 10/2020 Rechel ............... H02J 7/00712
12,308,633 B2 *  5/2025 Brenguier ............ H01H 9/548
(Continued)

OTHER PUBLICATIONS

International Search Report and Written Opinion dated Sep. 28, 2022 for corresponding International Application No. PCT/EP2022/063625, 10 pages.

Primary Examiner — Stephen W Jackson
(74) Attorney, Agent, or Firm — Wolf, Greenfield & Sacks, P.C.

(57) ABSTRACT

A switching device, a switching module and a control module configured to command the interruption of a current by way of the switching module in the event of a fault. The switching module includes a circuit carrying the current and including, in series, two back-to-back depletion-mode JFETs and a switching component that switches between two configurations. The switching component allows the current to flow in one configuration and prevents the current from flowing in the other configuration, which it is in by default. The control module generates a first signal for keeping the switching component in the first configuration, the control module being configured, in the event of a fault, to generate a second signal for commanding the interruption of the current by way of a transistor, and configured to interrupt the first signal in the event of a fault.

15 Claims, 4 Drawing Sheets

Figure 1:
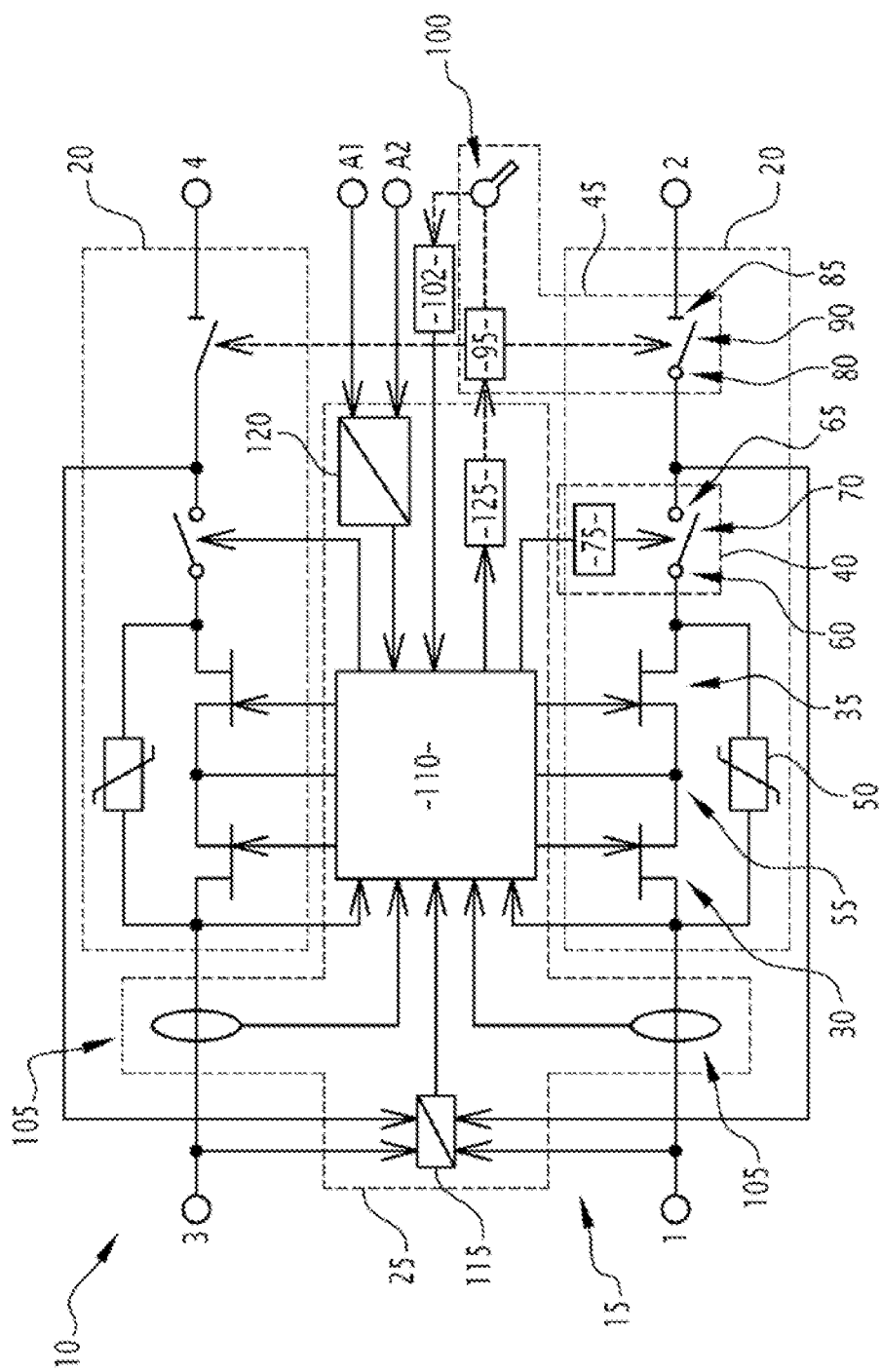

(51) Int. Cl.
*H03K 17/567* (2006.01)
*H03K 17/687* (2006.01)

(56) References Cited

U.S. PATENT DOCUMENTS

| | | |
|---|---|---|
| 2011/0026185 A1 | 2/2011 | Boudet et al. |
| 2014/0293666 A1 | 10/2014 | Merz et al. |
| 2020/0365345 A1 | 11/2020 | Telefus et al. |
| 2022/0231684 A1* | 7/2022 | Mehrotra ............. H03K 17/162 |

* cited by examiner

ELECTRICAL SWITCHING DEVICE, AND ASSOCIATED SWITCHING SYSTEM AND METHOD

The present invention relates to an electrical switching device. The present invention also relates to an associated switching system and method for switching a current.

Switching devices such as circuit breakers are frequently used for detecting electrical faults linked to an electrical current or electrical currents and for interrupting the current or currents in the case of a fault being detected. For this purpose, circuit breakers are equipped with means for detecting an electrical fault, these means actuating a switching device which interrupts the current when necessary.

The switching device is conventionally formed by an electrically conducting contact being mobile between two positions, one in which it electrically connects two terminals between which it conducts the current, and the other in which the contact is remote from at least one of the terminals. Such devices furthermore offer the advantage of galvanically isolating their two terminals from one another when the contact is in the second position, and thus of providing a very high level of protection, especially as their actuating mechanism holds them, by default, in the second position.

However, the mobile switching devices of the aforementioned type remain relatively slow, since the interruption generally requires one or more milliseconds. Furthermore, an electrical arc generally occurs between the mobile contact and the terminal or terminals from which it is removed during the interruption. Such an electrical arc requires a specific configuration of the switching device in order to be safely extinguished, via a large and complex arc-extinguishing chamber, and furthermore generates wear of the elements between which it is formed, which limits the lifetime of the switching device.

Therefore, instead and in place of the mobile contact, the use has been provided of one or more electronically controlled transistors, which then allow a faster interruption of the current without the appearance of an electrical arc. In order to ensure a sufficient protection, the transistors used are necessarily of a "non-conducting by default" type, in other words of a type that requires a positive action (receipt of a command on the gate of the transistor) in order to allow the current to flow, and which blocks the flow of the current in the absence of such an action. For example, MOSFET transistors have been provided for such a use.

However, the transistors that are non-conducting by default have a relatively high resistance to the flow of current, which is notably an issue because it leads to significant losses when the intensity of the current is high. It is therefore necessary to provide a large number of transistors in parallel in order to limit the losses by dividing the current, in such a manner that the intensity of the current flowing through each transistor is limited. Such a configuration is complex and bulky.

There accordingly exists a need for a device for switching an electrical current which has limited dimensions and a low electrical resistance while at the same time allowing a faster interruption of the current and having an improved lifetime over the switching devices of the prior art.

For this purpose, an electrical switching device is provided comprising an input, an output, a switching module and a control module, the switching module being designed to conduct an electrical current between the input and the output, the control module being set up for detecting an electrical fault and for commanding the interruption of the current by the switching module in the case of a fault being detected.

This switching module comprises an electrical circuit set up for conducting the current between the input and the output, the circuit comprising, in series, at least two first back-to-back normally conducting JFET transistors and at least one switching device comprising a first terminal and a second terminal, the switching device being set up for switching between a first configuration and a second configuration, the switching device allowing the current to flow between the first terminal and the second terminal when the switching device is in the first configuration, the switching device preventing the current from flowing when the switching device is in the second configuration, the switching device being in the second configuration by default, the control module being set up for generating at least a first electrical signal designed to hold the switching device in the first configuration, the control module being set up for, in the case of a fault being detected, generating at least a second interruption electrical signal sent to a first transistor, each second signal being designed to control the interruption of the current by the corresponding first transistor, the control module being set up for interrupting the first signal in response to the detection.

By virtue of the invention, the current is rapidly shut off by the JFET in the case of detection of an electrical fault. Furthermore, the switching device, being in the second configuration and hence non-conducting by default, ensures that this protection is maintained even when the control module is not electrically powered and hence cannot keep the JFETs in their non-conducting state.

Moreover, since the JFETs interrupt the current very rapidly, the switching device does not need to be dimensioned in such a manner as to enable this interruption, but only to maintain the isolation. In particular, no electrical arc occurs even if the switching device is of the mobile contact type, which limits its wear and hence obviates the need for an arc-extinguishing chamber, while at the same time allowing the use of the device 15 in an explosive atmosphere.

Generally speaking, the switching device may exhibit a high electrical conductivity since it does not have to interrupt high currents and hence does not have to withstand a high over-voltage during the interruption, this role being played by the JFETs, which naturally exhibit a very high conductivity. The electrical resistance of the switching device is therefore low.

Thus, the main defects of the JFETs—the fact they are by default conducting, which is generally considered as disqualifying them for use in an electrical switching device—is compensated by the presence of the switching device without their advantages (their high conductivity) being compensated by the electrical resistance of the switching device since the latter remains limited.

According to advantageous, but not obligatory, aspects of the invention, the switching device exhibits one or more of the following features, taken in isolation or according to all the technically possible combinations:

the switching device comprises a first actuator and a first electrically-conducting contact, the first contact being mobile between a first position and a second position, the first contact being in the first position when the switching device is in the first configuration and being in the second position when the switching device is in the second configuration, the first contact conducting the current between the first terminal and the second terminal when the first contact is in the first position, the first contact being distant from at least one of the first and second terminals when the first contact is in the second position, the first actuator being set up for keeping the first contact in the first position when the actuator is supplied with the first electrical signal.

the switching device comprises two second back-to-back MOSFET transistors, of the non-conducting by default type, in series between the first terminal and the second terminal, each second transistor conducting the current when the second transistor is supplied with a respective first signal and preventing the current from flowing in the absence of a first signal.

the circuit furthermore comprises an isolator connected in series with the first transistors and with the switching device, the isolator comprising a third terminal, a fourth terminal, a second contact, a second actuator and a control device, the second contact being mobile between a third position and a fourth position, the second contact conducting the current between the third terminal (80) and the fourth terminal when the second contact is in the third position, the second contact being distant from at least one of the third and fourth terminals when the second contact is in the fourth position, the second actuator being set up for moving the second contact between the third position and the fourth position when the control device is actuated by an operator.

the control device is a rotary lever.

the device comprises a control device which may be actuated by an operator for commanding the interruption, via the control module, of the first signal.

each first transistor comprises a source, a drain and a gate, the sources of two of the first transistors being interposed, along the path of the current, between the drains of said two first transistors.

the number of first transistors is greater than or equal to four, the first transistors being distributed into pairs of groups of first transistors, each group containing at least one first transistor, the first transistors of each group being successively connected to one another in series in the same direction if the group comprises more than one first transistor, each first transistor of a group being in the opposite direction to the first transistor or transistors of the other group of the same pair, each group of a pair being connected in series to the other group of the pair, the pairs being connected in series with one another.

the first transistors are made of SiC or of GaN.

the device comprises a single input and a plurality of outputs, each output being connected to a single point, the first transistors being interposed between the input and said single point, the switching module comprising, for each output, a respective switching device interposed between the output and said single point.

the device comprises a switching device and a control device, the switching device comprising the switching module, the control device comprising the control module, the switching device and the control device being remote from one another and being set up for communicating with one another.

A switching system is also provided, set up for transmitting a plurality of currents between inputs and respective outputs, for detecting an electrical fault depending on measurements of parameters of at least one current, and for interrupting at least the corresponding current when an electrical fault is detected, comprising a plurality of switching devices such as previously described.

A method is also provided for switching a current, implemented by an electrical switching device comprising an input, an output, a switching module and a control module, the switching module being designed to conduct an electrical current between the input and the output, the switching module comprising an electrical circuit set up for conducting the current between the input and the output, the circuit comprising, in series, at least two first back-to-back, normally-conducting JFET transistors and at least one switching device comprising a first terminal and a second terminal, the switching device being set up for switching between a first configuration and a second configuration, the switching device allowing the current to flow between the first terminal and the second terminal when the switching device is in the first configuration, the switching device preventing the current from flowing when the switching device is in the second configuration, the switching device being in the second configuration by default, the method comprising steps for:
generation, by the control module, of at least a first electrical signal designed to hold the switching device in the first configuration,
detection of an electrical fault by the control module,
following the detection of a fault, interruption of the first signal by the control module and generation by the control module of a second interruption electrical signal sent to each first transistor,
following the receipt of the corresponding second signal, interruption of the current by at least one first transistor, and
switching of the switching device into the second configuration.

Figure 2:
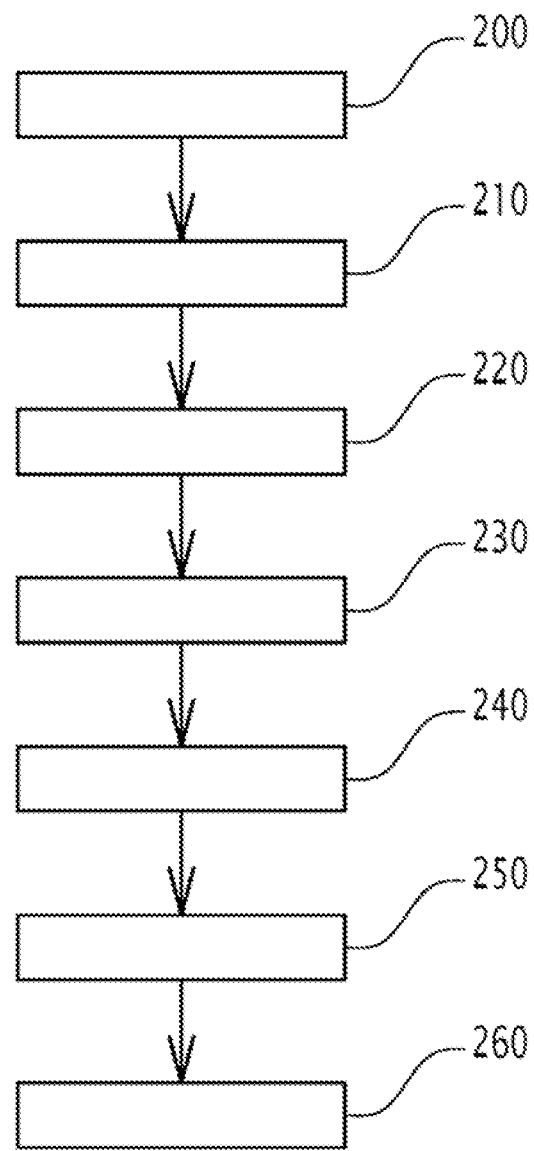
Figure 3:
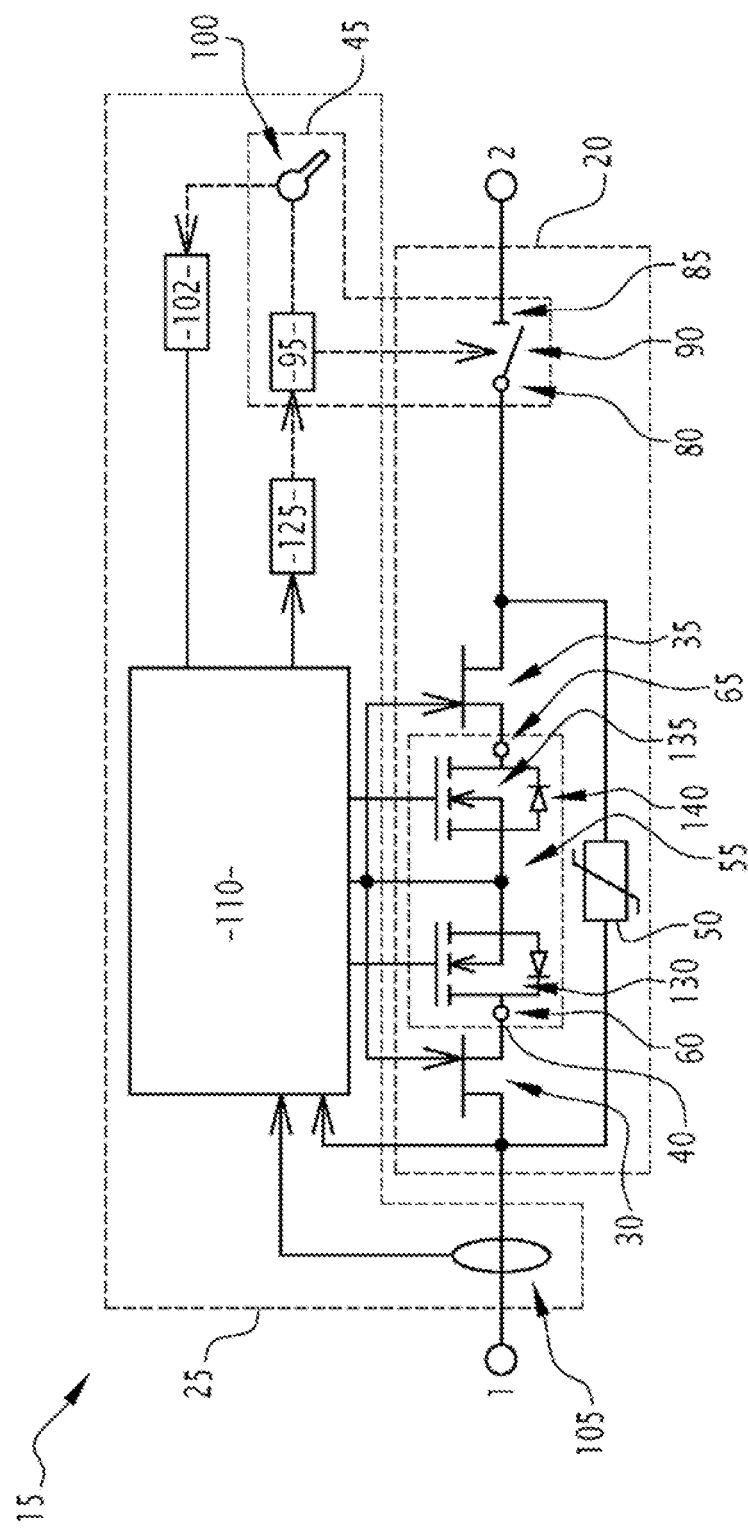
Figure 4:
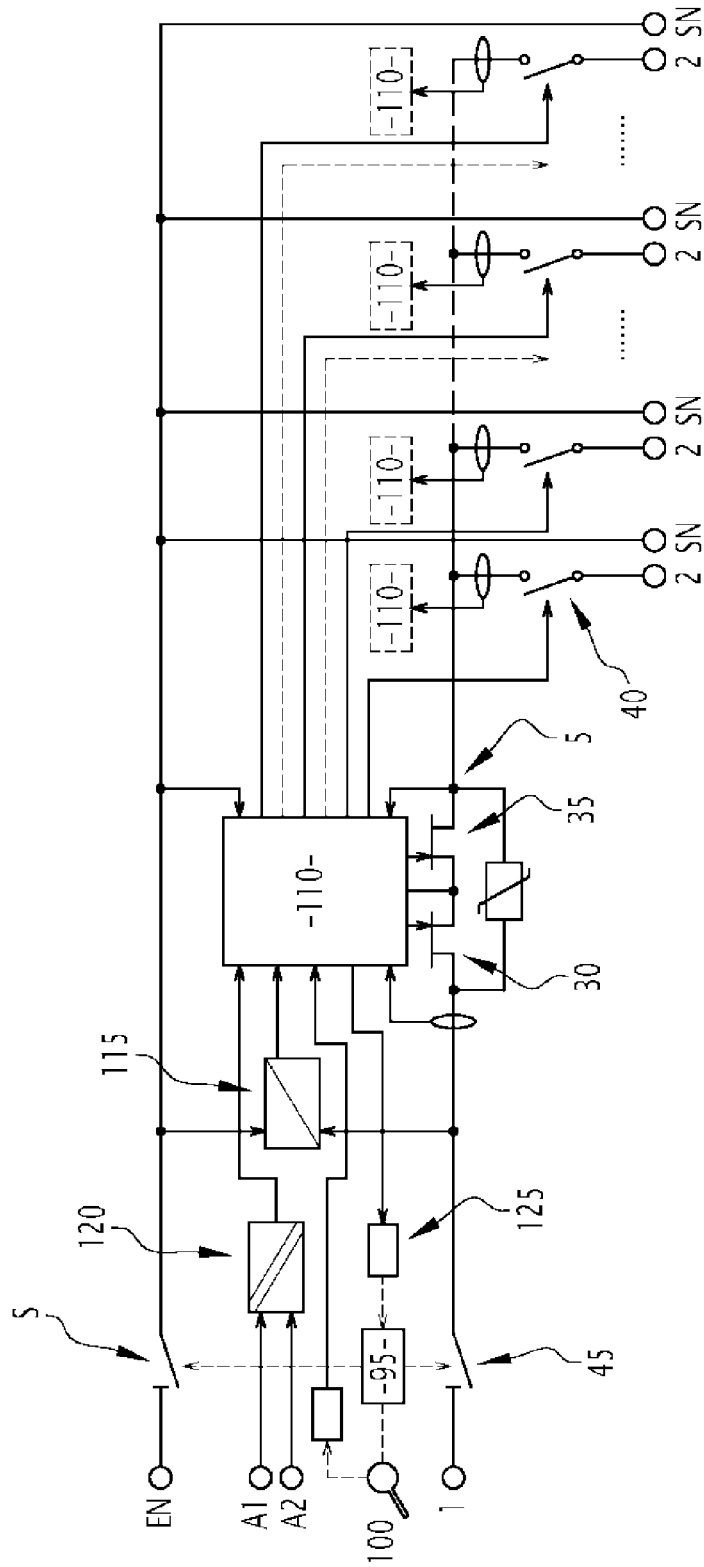

Features and advantages of the invention will become apparent upon reading the description that follows, given solely by way of non-limiting example and presented with reference to the appended drawings, in which:

FIG. 1 is a schematic representation of one example of a switching system according to the invention comprising a first example of a switching device according to the invention, FIG. 2 is a flow diagram of a switching method implemented by the switching device in FIG. 1, FIG. 3 is a schematic representation of a second example of a switching device according to the invention, and FIG. 4 is a schematic representation of a second example of a switching system according to the invention.

One example of a switching system 10 according to the invention is shown in FIG. 1. A second example of a switching system 10 will be shown and described later on.

The switching system 10 has at least one input 1, 3 and at least one output 2, 4. In particular, the number of inputs 1, 3 is equal to the number of outputs 2, 4. In the example shown in FIG. 1, the number of inputs and of outputs is equal to two, however this number may vary.

The switching system 10 is set up for receiving a current on each of its inputs 1, 3, and for transmitting each current to a respective output 2, 4.

Optionally, the switching system 10 also comprises a neutral input EN and one or more neutral output(s) SN, the switching system 10 being set up for conducting a current between the neutral input EN and the neutral output or outputs SN and, in a manner known per se, for interrupting this current by means of a neutral isolator S.

The switching system 10 is, furthermore, set up for detecting an electrical fault relating to at least one of the currents and for interrupting said current, or a plurality of the currents, notably all the currents, when the fault is detected.

The switching system 10 comprises at least one switching device 15, and in particular a switching device 15 for each pair formed by an input 1, 3 and an output 2, 4.

In FIG. 1, the switching system 10 is a bipolar system, i.e. a system 10 with two poles, or with two electrical phases, without a neutral.

Those skilled in the art will be able to readily adapt such a switching system, for example, to mono-, bi-, tri- or quadripolar installations, with or without a neutral. Each pole of the installation will be associated with an input 1, 3 and a respective output 2, 4, notably with a corresponding switching device 15, the neutral being associated with the corresponding input EN and output SN of the system 10.

The various switching devices 15 corresponding to the various poles of the system 10 are, for example, identical to one another.

Each switching device 15 comprises the input 1, 3 and the corresponding output 2, 4 and is set up for conducting an electrical current received on the input 1, 3 from the input 1, 3 to the output 2, 4.

The current is, for example, a DC current, but, as a variant, may be an AC current. The current is associated with an electrical voltage between the input 1, 3 and the output 2, 4.

Each switching device 15 is, furthermore, set up for detecting an electrical fault relating to the current that it is conducting and for interrupting said current in the case of a fault being detected.

Each fault is, for example, an excessive intensity of the current, a short-circuit, an over-voltage, an excessive temperature of an internal component, an internal failure after a self-test of the circuit breaker, an under-voltage, an abnormal shape of the voltage (non-sinusoidal for example on an AC line supply), or else an electrical arc.

Aside from the input 1, 3 and the corresponding output 2, 4, each switching device 15 comprises a switching module 20 and a control module 25.

It should be noted that certain elements of the switching devices 15, notably the control module 25, may be specific to a single switching device 15 or common to several switching devices 15, as the case may be.

Each input 1, 3 or output 2, 4 is set up so as to be connected to an incoming or outgoing electrical conductor of the current, for example to a conducting wire or cable, or else to an input or output terminal of another electrical device.

The switching module 20 comprises an electrical circuit connecting the input 1, 3 to the output 2, 4 and set up for conducting the current between the input 1, 3 and the output 2, 4.

The electrical circuit comprises, connected in series, at least two first transistors 30 and 35 and a switching device 40. Optionally, the circuit furthermore comprises an isolator 45.

Optionally, the switching module 20 furthermore comprises a clipping circuit 50.

Each first transistor 30, 35 is a JFET transistor.

The acronym JFET, for "Junction Field-Effect Transistor", denotes a field-effect transistor whose gate is directly in contact with the semiconductor channel connecting the source and the drain, the channel being interposed between two semiconductor portions having a type of doping different from that of the channel, such that the modification of the potential of the gate (connected to one of these two portions) tends to increase the size of the depletion region which appears at the junction between the channel and said portions. Thus, if the voltage is sufficient, the channel is entirely depleted and rendered electrically insulating.

Each first transistor 30, 35 is, notably, a JFET with a channel of the n type.

Each first transistor 30, 35 is conducting by default (or "normally conducting"). In other words, each first transistor 30, 35 is such that, in the absence of an action on the gate of the first transistor 30, 35, the first transistor 30, 35 allows a current to flow between the source and the drain.

The first transistors 30, 35 are reverse connected in the electrical circuit, in other words the current flows from the source to the drain in one of the first transistors 30, 35 and from the drain to the source in the other first transistor 30, 35.

Thus, the expression "back-to-back" denotes first transistors 30, 35 connected in opposing directions.

Notably, each first transistor 30 is connected in the opposing direction to the direction of each first transistor 35.

According to one embodiment, the sources of the two first transistors 30, 35 are interposed between the drains of the two first transistors 30, 35 along the path of the current.

In the example of a switching device 15 in FIG. 1, the sources of the two first transistors 30, 35 are connected together at a point 55.

Optionally, the number of first transistors 30, 35 is different from two, for example equal to four, six or any even number.

In this case, the first transistors 30, 35 are divided into two groups of first transistors 30, 35, the transistors 30, 35 which belong to the same group being disposed in the same direction and successively connected to one another in series.

As a variant, two pairs of groups or more are present, each pair comprising a group of first transistors 30 connected to one another in series and a group of first transistors 35 connected to one another in series, the two groups of the pair being connected to one another in series.

The various pairs of groups are connected to one another in parallel.

According to one variant, each pair comprises a single first transistor 30 and a single first transistor 35 connected in series, the pairs being connected to one another in parallel.

According to another variant, the electrical circuit comprises a plurality of groups of first transistors 30, 35, the groups being connected to one another in series.

Each group then comprises at least two first transistors 30 or at least two first transistors 35, the first transistors 30, 35 of the same group being connected to one another in parallel. In particular, each group only contains first transistors 30, 35 oriented in the same direction, and there exists at least one group of first transistors 30 oriented in one direction and at least one group of first transistors 35 oriented in the other direction. Thus, irrespective of the direction of the current, at least one of the groups of first transistors 30, 35 prevents the current from flowing.

For example, the first transistors 30 of a group are all connected at one end to the same point as the first transistors 35 of a neighboring first group and, optionally, at another end to the same point as the first transistors 30 or 35 of a neighboring second group.

Each first transistor 30, 35 is, for example, made of silicon carbide SiC. As a variant, at least one first transistor 30, 35, notably each first transistor 30, 35, is made of another semiconductor material, for example of gallium nitride GaN or else of silicon. The material used depends notably on the voltages and on the intensities of the currents that the switching device 15 is designed to withstand.

The switching device 40 comprises a first terminal 60 and a second terminal 65. The first terminal 60 is, for example, connected to one of the first transistors 30, 35.

The switching device 40 is set up for switching between a first configuration and a second configuration.

When the switching device 40 is in the first configuration, the switching device allows the current to flow between the first terminal 60 and the second terminal 65.

When the switching device 40 is in the second configuration, the switching device electrically isolates the first terminal from the second terminal 65.

The switching device 40 is set up for switching between the first and the second configuration upon receiving a first control signal from the control module 25.

The switching device 40 is set up so as to be, by default, in the second configuration. In other words, in the absence of a first control signal transmitted by the control module 25, the switching device 40 is in the second configuration.

According to the embodiment shown in FIG. 1, the switching device 40 is a relay comprising a first contact 70 and a first actuator 75.

The switching device 40 is, notably, not dimensioned for interrupting by itself the current flowing between the input 1, 3 and the output 2, 4. In particular, the switching device 40 is not set up for extinguishing a potential electrical arc appearing between the first contact 70 and one or the other of the terminals 60, 65. The switching device 40 is, for example, not equipped with an arc-extinguishing chamber.

However, the switching device 40 is, for example, set up for preventing a current from flowing between the terminals 60, 65 if the voltage between the input 1, 3 and the output 2, 4 is applied between the terminals 60 and 65.

It should be noted that, according to variants that may be envisioned, the switching device 40 is dimensioned for extinguishing the current by itself if necessary, for example by extinguishing a potential electrical arc resulting from it.

The first contact 70 is electrically-conducting and is mobile between a first position and a second position, shown in FIG. 1.

When the switching device 40 is in the first configuration, the first contact 70 is in the first position. When the switching device 40 is in the second configuration, the first contact 70 is in the second position.

When the first contact 70 is in the first position, the first contact 70 electrically connects the two terminals 60 and 65, for example by being pushed against the two terminals 60 and 65.

When the first contact 70 is in the second position, the first contact 70 is distant from at least one of the terminals 60 and 65. Thus, the first contact 70 does not allow the current to flow between the terminals 60 and 65.

Numerous types of mechanisms, notably rotating, are able to be used to provide the mobility and the guidance of the first contact 70.

According to embodiments that may be envisioned, the relay 40 is a MEMS (for "Micro Electro-Mechanical System") relay. A MEMS relay, at least a part of which is of microscopic dimensions, is fabricated using semiconductor materials. For example, a beam of microscopic dimensions deforming under the effect of an electric field plays the role of first contact 70. Such relays, which are very small, do not allow high currents to be interrupted with no electrical arc, but do switch very rapidly, their switching time being typically of the order of 10 microseconds.

As a variant, the relay 40 is a relay of macroscopic dimensions of a known type. The first actuator 75 is set up for moving the first contact 70 between the first position and the second position following the receipt of a first control signal, notably of a first electrical control signal, from the control module 25.

In particular, the first actuator 75 is set up for holding the first contact 70 in the second position in the absence of a first control signal, and for moving the first contact 70 into the first position and holding it there when the first actuator 75 is supplied with the first control signal.

For example, the first actuator 75 is of a known type comprising a spring and an electromagnet, the spring tending to move the first contact 70 toward its second position and the electromagnet being set up, when it is supplied with the first control signal, for exerting, directly or indirectly, on the first contact 70, a force tending to move the first contact 70 toward its first position. However, numerous types of first actuators 75 are able to be envisioned. For example, if the relay 40 is a MEMS relay, the actuator 75 is an electrostatic actuator.

The isolator 45 is interposed between the switching device 40 and the output 2, 4. The isolator 45 comprises a third terminal 80 connected to the switching device 40, a fourth terminal 85 connected to the output, a second contact 90, a second actuator 95 and a control device 100.

The second contact 90 is electrically-conducting and is mobile between a third position and a fourth position, shown in FIG. 1.

When the second contact 90 is in the third position (or "ON position"), the second contact 90 electrically connects the two terminals 80 and 85, for example by being pushed against the two terminals 80 and 85.

When the second contact 90 is in the fourth position (or "OFF position"), the second contact 90 is distant from at least one of the terminals 80 and 85. Thus, the second contact 90 does not allow the current to flow between the terminals 80 and 85. Numerous types of mechanisms, notably rotary, are able to be used to provide the mobility and the guidance of the second contact 90.

The isolator 45 is, notably, set up for maintaining an isolation between the terminals 80 and 85, even if the voltage between the input 1, 3 and the output 2, 4 is applied between the terminals 80 and 85. For example, the distance between the second contact 90 and at least one of the terminals 80, 85, when the second contact 90 is in the fourth position, is such that an electrical arc does not occur between the terminals 80 and 85 when the voltage is applied between these terminals. This distance is, notably, greater than or equal to 3 millimeters (mm), but may vary from one embodiment to another, notably as a function of the voltage applied between the various elements of the installation.

The second actuator 95 is set up for moving the second contact 90 between the third position and the fourth position following the receipt of a second control signal, notably a second electrical control signal, from the control module 25.

In particular, the second actuator 95 is set up for holding the second contact 90 in the fourth ("OFF") position in the absence of a second control signal, and for moving the second contact 90 into the third ("ON") position and holding it there when the second actuator 95 is supplied with the second control signal.

For example, the second actuator 95 is of a type comprising a spring and an electromagnet, the spring tending to move the second contact 90 toward its fourth position and the electromagnet being set up, when it is supplied with the second control signal, for exerting, directly or indirectly, on the second contact 90, a force tending to move the second contact 90 toward its third position. However, numerous types of second actuator 95 may be envisioned.

Optionally, the second actuator 95 is also set up for opening the neutral isolator S at the same time as the isolator 45.

The control device 100 is set up so as to be actuated by an operator in such a manner as to act on the second actuator 95 so that the second actuator 95 moves the second contact 90 between its third and fourth positions.

In a manner known per se, the control device 100 is, for example, a rotary lever, or else a button, moveable by the operator between two positions for controlling the movement of the second contact 90.

Optionally, the control device 100 is, furthermore, set up for, when it is moved by an operator in such a manner as to move the second contact 90 toward its fourth position, acting on the control module 25 so that the control module 25 commands the interruption of the current by the first transistors 30, 35 and by the switching device 40.

As a variant, the control device 100 is set up for controlling the movement of the second contact 90 by means of the control module 25, for example by sending a signal to the control module 25 which, in response, controls the second actuator 95. The controller 110 is, for example, designed to receive from a sensor 102 information on the position of the control device 100.

According to optional embodiments, the control device 100 comprises a locking mechanism designed to hold the control device 100 in the position in which the control device 100 keeps the second contact 90 in the fourth position. Such a mechanism then allows the dispatch of the installation which is downstream of the device 10.

The sensor 102 is set up for detecting a position of the control device 100, notably for detecting that the control device 100 is reaching, during its movement, a position preceding the position in which the control device 100 causes the opening of the isolator 45. The sensor 102 is, for example, an optical sensor designed to detect the passage in front of the optical sensor of a part of the control device 100 when the control device 100 reaches the position preceding the position in which the control device 100 causes the opening of the isolator 45.

The control module 25 is set up for detecting the electrical fault and for controlling, in response, the interruption of the current by at least the first transistors 30, 35 and the switching device 40.

The control module 25 comprises at least a monitoring device 105, a controller 110, a main power supply 115 and, optionally, an auxiliary power supply 120.

In the example shown in FIG. 1, a single controller 110, a single main power supply 115 and a single auxiliary power supply 120 are common to the various switching devices 15, however, as a variant, these elements of the various switching devices 15 may be distinct from one another. According to another variant, several power supplies 115 and/or several power supplies 120 may be present for powering the controller 110 in a redundant manner and thus to avoid the failure of one of them being sufficient to disable the system 10.

Each monitoring device 105 is set up for monitoring the current flowing in the switching device 15.

For example, each monitoring device 105 is set up for measuring values of the intensity of the current and for transmitting these values to the controller 110, for example in the form of an electrical signal, a voltage or a current of which is a function of the intensity of the current. In this case, the monitoring device 105 is, for example, a toroidal coil, notably a Rogowsky coil. However, other types of current sensors may be used, for example Hall-effect sensors or else shunt sensors, amongst others.

The controller 110 is set up for detecting the occurrence of an electrical fault of the current, for example based on the measured values. The criteria for detection of the various faults are known per se, and sometimes established by standards, and are not described here.

The controller 110 is, furthermore, set up for controlling a switching of each first transistor 30, 35. For example, the controller 110 is set up for generating, in response to the detection of a fault, a third electrical signal sent to each first transistor 30, 35, the or each third signal being designed to cause the interruption of the current by the first transistor or transistors 30, 35.

Each third signal is, for example, an electrical voltage between the source and the gate of the first transistor 30, 35, the voltage being such that the conducting channel of said first transistor 30, 35 is pinched and hence interrupted by the two depletion regions between which the channel is interposed.

According to one embodiment, the controller 110 is electrically connected to each of the gates of the first transistors 30, 35 and to the point 55, in such a manner as to impose an electrical voltage between the gates and the point 55, whose potential is equal to the potential of the sources of the first transistors 30, 35.

Optionally, if two groups of transistors 30, 35 are present, each third signal is simultaneously transmitted at least to the transistors 30, 35 which are in the same direction, for example to all the transistors 30, 35.

The controller 110 is set up for generating the first control signal and for transmitting it to the switching device 40 in such a manner as to keep this switching device 40 in the first position.

The controller 110 is, furthermore, set up for controlling the switching of the switching device 40 from the first configuration to the second configuration in response to the detection of a fault, for example by interrupting the first signal.

The controller 110 is, additionally, optionally set up for controlling the switching of the isolator 45 to its fourth position in the case of a fault being detected, for example by generating or by interrupting the second electrical signal.

According to one embodiment, the controller 110 controls the switching of the isolator 45 to its fourth position by electrically supplying a conducting coil 125 with the second signal, in such a manner as to exert a force on the second actuator 95 causing the opening of the isolator 45 via the second actuator 95.

It should be noted that many different means could be used to allow the controller 110 to act on the isolator 45 in such a manner as to cause its switching.

The controller 110 is, for example, formed by a processor and a memory storing a set of software instructions, the software instructions leading to the implementation of one example of the switching method, described hereinafter, when they are implemented on the processor.

As a variant, the controller 110 is formed by a set of programmable logic components by one or more dedicated circuits, notably one or more integrated circuits, or by a whole assembly of electrical or electronic components.

The main power supply 115 is set up for electrically powering the controller 110 and, optionally, the monitoring device or devices 105, with one or more power supply currents generated from the electrical current or currents flowing through the switching device or devices 15.

The auxiliary power supply 120 is set up for electrically powering the controller 110 and, optionally, the monitoring device or devices 105, with one or more power supply currents generated for example from an electrical energy store A1 such as a battery or a capacitor, or received from a source A2 external to the system 10, for example from an electricity distribution system.

The clipping circuit 50 is connected in parallel to the two first transistors 30, 35 and is set up for preventing an electrical voltage between the end terminals, for example between the drains, of the two first transistors 30, 35 from exceeding a predetermined voltage threshold. Clipping circuits 50 of many types are known to a person skilled in the art, using for example a varistor or else one or more Zener diode(s). Such circuits are sometimes referred to as "TVS", which stands for "Transient-Voltage Suppressor".

A flow diagram of the switching method is shown in FIG. 2.

The method comprises an initial step 200, a step 210 for detecting a fault, a control step 220, a first interruption step 230, a second interruption step 240, a switching step 250 and an actuation step 260.

During the initial step 200, the switching device 40 is in its first configuration and the mobile contact 90 of the isolator 45 in its third position. Furthermore, the controller 110 does not generate the third signal, and the first transistors 30, 35 are therefore conducting.

Thus, an electrical current flows between the input 1, 3 and the output 2, 4, allowing the generation of an electrical supply current by the main power supply 115. The controller 110 uses the power supply current for generating the first electrical signal which keeps the switching device 40 in its first configuration.

During the detection step 210, the controller 110 detects the occurrence of a fault, for example based on values of intensity of the current measured by the monitoring device 105.

In response to the detection of the fault, the controller 110 generates, for each first transistor 30, 35, the third corresponding control signal, and transmits each third control signal to the first transistor 30, 35 to which it is addressed, during the control step 220. For example, the controller 110 applies a predefined voltage between the gate and the source of each first transistor 30, 35, and maintains this voltage for as long as the electrical power supply of the controller 110 allows it.

During the first interruption step 230, the controller 110 interrupts the first control signal. Optionally, during this step, the controller 110 furthermore sends out the second control signal to the second actuator 95 or, where relevant, to the coil 125. Optionally, the first control signal is interrupted after the expiration of a predetermined period of time, this period of time being measured starting from the generation of each third control signal.

The period of time is, for example, in the range between 5 nanoseconds and 10 milliseconds, but may vary from one embodiment to another.

As a variant, the first control signal is interrupted by the controller 110 after the controller 110 has measured that the intensity of the current flowing between the input 1, 3 and the output 2, 4 is less than or equal to a threshold in absolute value, notably equal to zero.

The generation of the second control signal, provided for controlling the opening of the isolator 45, is for example simultaneous with the interruption of the first control signal.

Optionally, if a neutral isolator S is present, a command to interrupt the neutral isolator S is sent out during the step 230.

During the second interruption step 240, the current is interrupted by at least one of the first transistors 30, 35.

Indeed, since the two first transistors 30, 35 are connected back-to-back in the electrical circuit, at least one of the first transistors 30, 35 is effectively non-conducting under the effect of the corresponding third control signal irrespective of the direction of the current, including if the current is an alternating current.

In particular, the current flows through the switching device 15 at the start of the second interruption step 240, and is interrupted by the switching of the first transistors 30, 35.

During the switching step 250, the switching device 40 switches to its second configuration. Optionally, the mobile contact 90 of the isolator 45 switches to its fourth position.

It should be noted that it is not the switching of the switching device 40 nor that of the isolator 45 that leads to the interruption of the current. Indeed, since the switching of the transistors 30, 35 is very fast, it generally takes place before the switching of the device 40 has been able to finish. In the case where the device 40 were capable of switching very rapidly, the aforementioned time period ensures that the transistors 30, 35 switch prior to the device 40.

For example, the switching step 250 is implemented after the second interruption step 240.

As a variant, the movement of the mobile contact 70 begins before the current is interrupted by the first transistors 30, 35, but this interruption occurs before the appearance of an electrical arc between the contact 70 and the terminal 65.

The actuation step 260 is implemented after the switching step 250. In particular, during the actuation step, following the interruption of the current by the first transistors 30, 35, the controller 110 is not electrically powered and does not therefore transmit the third signal to the first transistors 30, 35 which are therefore conducting, nor the second signal to the switching device 40, which is therefore in the second configuration.

Optionally, the neutral isolator S is interrupted during the step 260, if such a neutral isolator S is present.

During the actuator step 260, an operator acts on the handle 100 in order to close the isolator 45 and thus to electrically connect the terminals 80 and 85. However, although the first transistors 30, 35 are conducting, the switching device 40, being by default in the second configuration, prevents the current from flowing.

Thus, the current is interrupted rapidly by the JFETs 30, 35 when an electrical fault is detected. Furthermore, the switching device 40, being in the second configuration and hence non-conducting by default, ensures that this protection is maintained even when the control module is not electrically powered and hence no able keep the JFETs 30, 35 in their non-conducting state, for example if an operator actuates the handle 100. Thus, despite the use of first transistors 30, 35 that are conducting by default, the electrical protection of the installation remains assured even if the controller 110 is non-functional.

In addition, since the JFETs interrupt the current very rapidly, the switching device does not need to be dimensioned in such a manner as to allow this interruption, but only to maintain the isolation. In particular, no electrical arc occurs even if the switching device is of the mobile contact type, which limits its wear and hence avoids the need for an arc-extinguishing chamber. Generally speaking, the switching device may have a high electrical conductivity since it doesn't have to interrupt high currents, this role being played by the JFETs, which themselves naturally exhibit a very high conductivity. The electrical resistance of the switching device is therefore low.

Furthermore, the JFETs 30, 35 tend to saturate and thus to limit the intensity of the current which flows through them when this intensity is very high, for example in the case of a short-circuit, and hence thus participate in the protection of the network even before they are turned off.

When the switching device 40 is a relay comprising a mobile contact 70, the switching device 40 reliably enables an effective isolation even in the absence of electrical power to the control module 25.

The use of a separate isolator 45 for the switching device 40 allows an operator to manually interrupt the current without however the operator being able, by an inverse movement, to cause the current to flow at a moment where the controller 110, non-functional since for example not electrically powered, would not be able to monitor the presence of a fault and interrupt the current via the first transistors 30, 35. Furthermore, the isolator 45 allows a galvanic isolation between the input 1, 3 and the output 2, 4.

A rotary lever 100 is an efficient means allowing the operator to control the isolator 45.

When the sources of two of the first transistors 30, 35 are connected together, the controller 110 can control the switching of these two transistors 30, 35 simply by acting on the mid-point 55 and/or on the gate voltage of the transistors 30, 35, and hence control the two transistors 30, 35 by means of a single signal.

JFETs made of SiC or GaN are designed to conduct high currents safely.

If two groups of first transistors 30, 35 are used, the transistors 30, 35 of each group being connected in the same direction, several transistors necessarily participate at the same time in the interruption of the current, irrespective of the direction of the latter. Thus, the constraints relating to the dimensioning of the transistors 30, 35 are more limited since each one only has to handle a part of the function for interrupting the current and only has to withstand a part of the total voltage which appears during this interruption.

If several pairs of transistors 30, 35 or several pairs of groups of transistors 30, 35 are connected in parallel with one another, the total resistance between the input 1, 3 and the output 2, 4 is reduced.

A second example of a switching device 15 is shown in FIG. 3 and will now be described. The elements identical to the first example in FIG. 1 are not described again here; only the differences are highlighted.

It should be noted that, although a single switching device 15 comprising only one switching module 20 and only one control module 25 dedicated to the single switching module 20 is shown, embodiments in which several switching devices such as that in FIG. 2, comprising only one common control module 25 or a plurality of control modules 25 each associated with one of the switching modules 20, are also envisioned.

The switching device 40 does not have a mobile contact 70, and instead comprises at least two second transistors 130 and 135, of a non-conducting by default type, connected in series between the two terminals 60 and 65.

The second transistors 130 and 135 are, for example, MOSFETs.

MOSFETs, according to the acronym "Metal Oxide Semiconductor Field Effect Transistor", also referred to as "insulated-gate field-effect transistor", are unipolar transistors.

MOSFETs that are non-conducting by default are referred to as "enhancement-type MOSFETs" and are designed so that the application of a predefined potential electrical on the gate leads to the accumulation of charge carriers in the channel which then allows the channel to be conducting, whereas in the absence of this potential the channel is lacking free charge carriers and is therefore insulating.

In the example shown in FIG. 3, the two second transistors 130 and 135 are interposed between the two first transistors 30, 35 and connected back-to-back together in series.

In particular, each second transistor 130, 135 is interposed between the source of a first transistor 30, 35 and the point 55. For example, the drains of the two second transistors 130, 135 are connected to the point 55 and the sources of these two second transistors 130, 135 are each connected to the source of a corresponding first transistor 30, 35 via a respective terminal 60, 65.

Furthermore, a diode 140 is connected in parallel between the source and the drain of each of the two second transistors 130, 135, the cathode of the diode being connected to the drain of the corresponding second transistor 130, 135 and the anode of the diode 140 connected to the source.

The gate of each second transistor 130, 135 is connected to the controller 110 in such a manner as to allow the controller 110 to render the second transistor 130, 135 conducting by the application of an electrical voltage between the point 55 (hence the sources of the second transistors 130, 135) and the gate.

The point 55 is, for example, electrically connected to the drains of the two second transistors 130, 135 and to the gates of the two first transistors 30, 35, so as to allow the controller 110 to simultaneously control the two first transistors 30, 35 by the application of an electrical voltage between the point 55 and the gates of the first transistors 30, 35 before the second transistors 130, 135 are turned off.

For example, the point 55 is connected to a first point, the potential electrical of which is fixed by the controller 110 (for example fixed by the electrical power supply of the controller 110), whereas the gates of the second transistors 130, 135 are connected to a second point the electrical potential of which the controller 110 is set up to modify, the first point and the second point being connected via a predefined resistance.

The gates of the first transistors 30, 35 are connected to a third point the electrical potential of which the controller 110 is set up to vary. The third point is, similarly, connected to the first point via a predefined resistance.

Such a configuration allows the MOSFETs 130, 135 and the JFETs 30, 35 to be controlled separately. In particular, it allows the voltage between the gate and the source of each of the JFETs 30, 35 to be varied without modifying the voltage between the gate and the source of the MOSFETs, and thus to adjust the conductivity of the JFETs 30, 35, notably by applying a slightly positive voltage (for example 2V) between the gate and the source of the JFETs, so as to increase its conductivity or by rendering the JFETs non-conducting by the application of a negative voltage (for example −15V), without changing the behavior of the MOSFETs 130, 135.

Thus, the assembly of the two second transistors 130, 135 and of the diodes 140 forms a switching device which is in its second configuration by default (in the absence of a voltage applied between the gate and the source of the transistors 130, 135) but the application of a voltage renders each of the two transistors 130, 135 conducting in one of the two possible directions of flow of the current, and hence even if the current is alternating.

The operation of the second example is similar to the first example, the turning off of the JFETs 30, 35 preceding the turning off of the second transistors 130, 135, which only therefore participate in keeping them turned off and not in the interruption of a current that is flowing, which therefore limits the constraints imposed on these second transistors 130, 135.

It should be noted that, although the switching device 40 has been described, in the second example, as being composed of two transistors 130, 135 successively connected between the two first transistors 30, 35, which allows the control of the switching module 20 to be simplified, the positioning of the transistors 130 and 135 in the electrical circuit could vary.

A switching device 40 with transistors, notably with MOSFETs, enables a faster switching than a relay with a mobile contact, while at the same time providing the isolation even in the absence of a control signal (i.e. in the case of a failure or of a lack of power to the controller 110). Furthermore, MOSFETS are small, which allows the size of the system 10 to be reduced with respect to a system 10 using a relay 40. Furthermore, MOSFETs are low cost components.

According to one embodiment, the role of switching device 40 is played by the isolator 45. In this case, the control means 100 do not directly act on the actuator 95, but act on the controller 110, which then electrically controls the actuator 95. In particular, the electrical signal supplying power to the actuator 95 is cut by the controller 110 following the actuation of the control means by the operator.

This thus avoids the isolator 45 being re-closed by the operator without the controller 110 being functional and being able to ensure the interruption of the current if necessary via the transistors 30, 35.

Although the device 40 has been described here as comprising either a relay or an assembly of MOSFETs, it is clear that other types of devices 40 could be used.

According to embodiments that may be envisioned, one example of which is shown in FIG. 4, the switching system 10 comprises a single switching device 15 comprising a single input 1 and a plurality of outputs 2, together with a single electrical circuit comprising at least two transistors 30, 35 between the input 1 and each output 2.

Notably, the two transistors 30, 35, or more, are interposed between the input 1 and a point 5 of the circuit to which all the outputs 2 are connected.

A switching device 40 is interposed between each output 2 and the point 5.

Whenever a fault is detected relating to a current supplied by an output 2 to an installation downstream of the output 2 in question, the controller 110 commands the interruption of the current between the input 1 and the point 5, together with the switching of each switching device 40 to its respective second configuration.

Subsequently, the controller 110 sends a command to the transistors 30, 35 to again allow the current to flow between the input 1 and the point 5, and it switches back each of the switching devices 40 which do not correspond to the output 2 with which the fault is associated into its first configuration. On the other hand, the switching device 40 which corresponds to the output 2 with which the fault is associated remains in its second configuration.

Thus, the interruption of the current in the case of a fault remains assured despite the use of a single controller 110 and especially of a single assembly of transistors 30, 35, whereas the interruption of the currents associated with the outputs 2 which have not given rise to a fault is very short. The structure of the switching system 10 is therefore simplified with respect to cases where the current to be sent to the various outputs 2, 4 were supplied to several inputs 1, 3 each associated with a distinct switching device 15 comprising its own assembly of transistors 30, 35 and its own switching device 40.

Such an embodiment is particularly suited to the use of MEMS relays as switching devices 40, allowing a fast switching and hence a very short interruption of the currents 2 which have not been associated with faults.

It should be noted that, as mentioned above, in the case of a fault being detected, the interruption of the current by the first transistors 30, 35 is controlled and effective before the switching device 40 and/or the isolator 45 are each switched into their configuration in which they prevent the current from flowing. This notably avoids having to dimension these devices 40, 45 for interrupting the current, notably for interrupting an electrical arc which would occur if the devices 40, 45 were manipulated to interrupt the current while the current is flowing.

Generally speaking, this is the case whatever the reason for the interruption of the current. In other words, the controller 110 is set up for systematically interrupting the first signal (which leads to the switching of the switching device 40 into its second configuration) at a moment in time such that one of the first transistors 30, 35 at least, notably the two first transistors 30, 35, has/have switched into their non-conducting state before the switching device 40 switches into its second position. For example, the first signal is interrupted subsequently or, at the latest, at the same moment in time when the current is interrupted by the first transistor or transistors 30, 35. This is the case for example if an external signal sends a command to the controller 110 for the interruption of the current, for example if it is desired to interrupt the current in order to work on an installation downstream.

When the system 10 is started, if the device 100 is in a position in which it closes the isolator 45, the controller 110 commands the switching of the switching device 40 from its second configuration (in which it prevents the current from flowing) to its first configuration (allowing the current to flow). Once the switching device 40 is in its first configuration, for example after a predetermined period of time sufficient to allow this switching has passed, then the controller 110 commands each first transistor 30, 35 to switch into its conducting state.

In the case of an action by an operator on the device 100 for interrupting the current, the sensor 102 detects that the device 100 is approaching the position in which the device 100 causes the opening of the isolator 45. Before this position is reached, the sensor 102 transmits to the controller 110 a signal which causes the generation of the third signals then, after a predetermined time period, cuts the first signal such that the current is interrupted by the first transistors 30, 35 prior to the interruption of the first signal.

In addition, the sensor 102 is set up in such a manner that the interruption of the current by the transistors 30, 35 takes place at a time when the mobile contact 90 is in contact with the two terminals 80 and 85, and before the mobile contact leaves one of these two terminals 80, 85. Thus, the interruption of the current is implemented by the transistors 30, 35 and not by the isolator 45.

When the device 100 is reset by the operator in order to re-establish the current, the controller 110 causes the closing of the device 40 prior to commanding the switching of the transistors 30, 35 into their conducting state by cutting the third electrical signal.

It should be noted that, although a switching device 15 is shown as a single unit in the figures, according to a variant that may be envisioned, the modules 20 and 25 could be situated in different parts of the switching device 15 and be remote from one another but able to communicate with each other.

For example, the switching device 15 comprises a first device comprising the switching module 20 and a second device comprising the control module 25. In this case, the first device (or "switching device") comprises for example a first housing and the second device (or "control device") comprises a second housing being separate and notably remote from the first housing.

The control device 25 is set up for transmitting the various electrical signals to the switching device 20, for example via an electrical conductor such as a cable.

The invention claimed is:

1. An electrical switching device comprising an input, an output, a switching module and a control module, the switching module being designed to conduct an electrical current between the input and the output, the control module being set up for detecting an electrical fault and for commanding an interruption of the current by the switching module in a case of a fault being detected,
   wherein the switching module comprises an electrical circuit set up for conducting the current between the input and the output, the electrical circuit comprising, in series, at least two back-to-back, normally-conducting first JFET transistors and at least one switching device comprising a first terminal and a second terminal, the switching device being set up for switching between a first configuration and a second configuration, the switching device allowing the current to flow between the first terminal and the second terminal when the switching device is in the first configuration, the switching device preventing the flow of the current when the switching device is in the second configuration, the switching device being in the second configuration by default, the control module being set up for generating at least a first electrical signal designed to hold the switching device in the first configuration,
   the control module being set up for, in the case of a fault being detected, generating at least a second interruption electrical signal sent to a first transistor, each second interruption electrical signal being designed to control the interruption of the current by the corresponding first transistor, the control module being set up for interrupting the first signal in response to the detection.

2. The electrical switching device as claimed in claim 1, in which the switching device comprises a first actuator and a first electrically-conducting contact, the first contact being mobile between a first position and a second position, the first contact being in the first position when the switching device is in the first configuration and being in the second position when the switching device is in the second configuration, the first contact conducting the current between the first terminal and the second terminal when the first contact is in the first position, the first contact being distant from at least one of the first and second terminals when the first contact is in the second position, the first actuator being set up for keeping the first contact in the first position when the actuator is supplied with the first electrical signal.

3. The electrical switching device as claimed in claim 1, in which the switching device comprises two second MOSFET transistors, of the non-conducting by default type, back-to-back in series between the first terminal and the second terminal, each MOSFET second transistor conducting the current when the second MOSFET transistor is supplied with a respective first signal and preventing the flow of the current in an absence of a first signal.

4. The electrical switching device as claimed in claim 1, in which the electrical circuit furthermore comprises an isolator connected in series with the first transistors and with the switching device, the isolator comprising a third terminal, a fourth terminal, a second contact, a second actuator and a control device, the second contact being mobile between a third position and a fourth position, the second contact conducting the current between the third terminal and the fourth terminal when the second contact is in the third position, the second contact being distant from at least one of the third and fourth terminals when the second contact is in the fourth position, the second actuator being set up for moving the second contact between the third position and the fourth position when the control device is actuated by an operator.

5. The electrical switching device as claimed in claim 4, in which the control device is a rotary lever.

6. The electrical switching device as claimed in claim 1, comprising a control device which may be actuated by an operator for commanding the interruption, via the control module, of the first signal.

7. The electrical switching device as claimed in claim 1, in which each first transistor comprises a source, a drain and a gate, the sources of two of the first transistors being interposed, along a path of the current, between the drains of said two first transistors.

8. The electrical switching device as claimed in claim 1, in which a number of first transistors is greater than or equal to four, the first transistors being divided into pairs of groups of first transistors, each group containing at least one first transistor, the first transistors of each group being successively connected to one another in series in the same direction if the group comprises more than one first transistor, each first transistor of a group being in the opposite direction to the first transistor or transistors of the other group of the same pair, each group of a pair being connected in series to the other group of the pair, the pairs being connected to one another in series.

9. The electrical switching device as claimed in claim 1, in which the first transistors are made of SiC or of GaN.

10. The electrical switching device as claimed in claim 1, comprising a single input and a plurality of outputs, each output being connected to a single point, the first transistors being interposed between the input and said single point, the switching module comprising, for each output, a respective switching device interposed between the output and said single point.

11. The electrical switching device as claimed in claim 1, comprising a switching device and a control device, the switching device comprising the switching module, the control device comprising the control module, the switching device and the control device being remote from one another and being set up for communicating with one another.

12. A switching system set up for transmitting a plurality of currents between inputs and respective outputs, for detecting an electrical fault relating to at least one of said currents, and for interrupting at least the corresponding current when an electrical fault is detected, comprising a plurality of electrical switching devices as claimed in claim 1.

13. A method for switching a current, implemented by an electrical switching device comprising an input, an output, a switching module and a control module, the switching module being designed to conduct an electrical current between the input and the output, the switching module comprising an electrical circuit set up for conducting the current between the input and the output, the electrical circuit comprising, in series, at least two back-to-back, normally-conducting first JFET transistors and at least one switching device comprising a first terminal and a second terminal, the switching device being set up for switching between a first configuration and a second configuration, the switching device allowing the current to flow between the first terminal and the second terminal when the switching device is in the first configuration, the switching device preventing the flow of the current when the switching device is in the second configuration, the switching device being in the second configuration by default, the method comprising:
- generating, by the control module, at least a first electrical signal designed to hold the switching device in the first configuration,
- detecting an electrical fault by the control module,
- following the detection of a fault, interrupting the first signal by the control module and generating by the control module a second interruption electrical signal sent to each first transistor,
- following a reception of the corresponding second interruption electrical signal, interrupting the current by at least one first transistor, and
- switching the switching device into the second configuration.

14. The electrical switching device as claimed in claim 1, wherein a controller of the control module is configured to generate the at least the second interruption electrical signal sent to the corresponding first transistor.

15. The method as claimed in claim 13, wherein a controller of the control module is configured to generate the second interruption electrical signal sent to each first transistor.

* * * * *